United States Patent [19]

Davies, Jr.

[11] Patent Number: 4,485,317
[45] Date of Patent: Nov. 27, 1984

[54] DYNAMIC TTL INPUT COMPARATOR FOR CMOS DEVICES

[75] Inventor: Thomas J. Davies, Jr., Gilroy, Calif.

[73] Assignee: Fairchild Camera & Instrument Corp., Mountain View, Calif.

[21] Appl. No.: 308,073

[22] Filed: Oct. 2, 1981

[51] Int. Cl.³ .................. H03K 19/094; H03K 5/24; H03K 3/356; G01R 19/165
[52] U.S. Cl. .................................. 307/475; 307/362; 307/530; 307/279
[58] Field of Search ............... 307/362, 450, 475, 246, 307/279, 288, 449, 463, 530

[56] References Cited

U.S. PATENT DOCUMENTS

| | | | |
|---|---|---|---|
| 3,938,109 | 2/1976 | Gionis et al. | 307/475 X |
| 3,959,781 | 5/1976 | Mehta et al. | 307/475 X |
| 4,096,402 | 6/1978 | Schroeder et al. | 307/362 |
| 4,110,639 | 8/1978 | Redwine | 307/362 X |
| 4,380,710 | 4/1983 | Cohen et al. | 307/475 |

FOREIGN PATENT DOCUMENTS 1196216  6/1970  United Kingdom ............... 307/279

Primary Examiner—Larry N. Anagnos
Attorney, Agent, or Firm—Ronald C. Fish; Ken Olsen; Carl Silverman

[57] ABSTRACT

A CMOS buffer for the dynamic translation of input signals at TTL levels to corresponding signals at CMOS levels. A reference voltage at a level between the 0.8 volt maximum TTL "0" input level and the 2.4 volt minimum "1" input level is generated by charge distribution between capacitors. This reference level is compared with an input signal level in a dynamic comparator comprised of a CMOS cross-coupled latch to produce output signals at CMOS levels that correspond to the TTL input signals.

6 Claims, 5 Drawing Figures

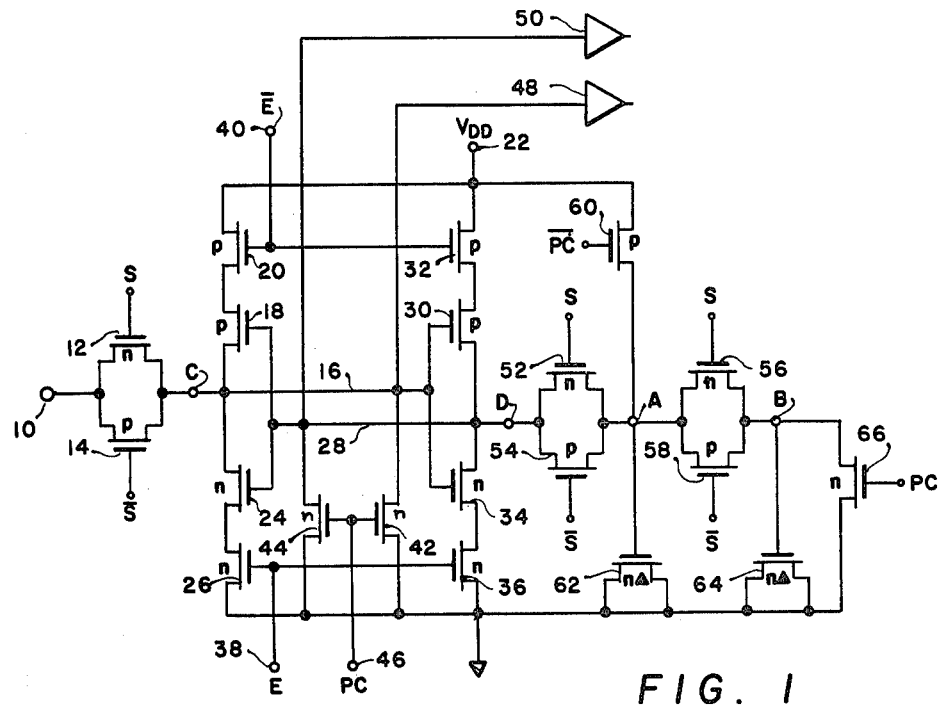
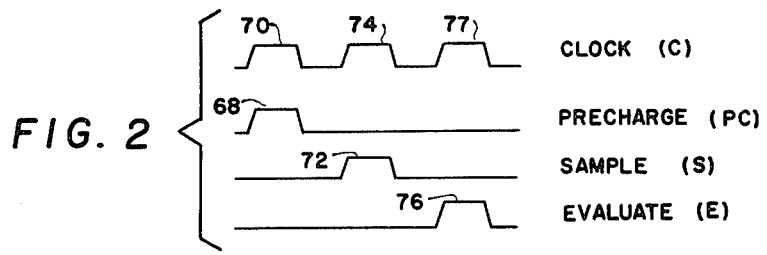
FIG. 1
FIG. 2

DYNAMIC TTL INPUT COMPARATOR FOR CMOS DEVICES

TECHNICAL FIELD

This invention relates to transistor circuitry and particularly to a novel buffer circuit for translating signals at TTL levels to corresponding signals at CMOS levels.

BACKGROUND ART

Interfacing circuits that receive signals at TTL input levels, evaluate the signal levels, and produce corresponding output signals at CMOS levels are necessary for use where TTL to CMOS buffering is required. Existing circuits of this type are typically used as input buffers to CMOS microprocessors requiring TTL compatibility but suffer the disadvantage of drawing a considerable amount of current from the associated microprocessor power source. Another problem encountered with prior art buffers of this type is that of device threshold sensitivity, or the ability of the buffer circuitry to evaluate with accuracy the state of a signal near the threshold voltage level of the TTL devices. The present buffer circuit consumes substantially no D.C. power and device threshold sensitivity is virtually eliminated.

DISCLOSURE OF THE INVENTION

Briefly described the circuitry of the invention includes a dynamic reference generator that establishes a precise predetermined reference voltage using charge redistribution techniques, that is between the maximum "0" TTL voltage level and the minimum "1" TTL voltage level. A dynamic comparator, coupled to the reference generator and separated therefrom by a sampling transistor switch, is implemented using CMOS techniques that consumes substantially no D.C. power and compares the reference voltage with the level of a TTL input signal to produce a corresponding output at CMOS levels. The circuitry is operated during three clock pulses of the associated system: The first pulse closes transistor switches that operate to initialize and precharge the various components of the circuitry, the second pulse opens the precharge switches and closes the sampling switches to redistribute charges to establish the desired reference voltage and to apply this reference voltage, and also the TTL input voltage, to the CMOS comparator; and the third pulse opens the sampling switches and couples the comparator circuitry with the D.C. power conductors so that the comparator operates as a cross-coupled latch to produce corresponding output signals at CMOS voltage levels.

BRIEF DESCRIPTION OF THE FIGURES

In the drawings that illustrate the preferred embodiment of the invention:

FIG. 1 is a schematic circuit diagram of the TTL to CMOS buffer;

FIG. 2 is a timing diagram illustrating the occurrence of various modes of operation of the buffer circuitry;

BEST MODE OF CARRYING OUT THE INVENTION

Figure 3:
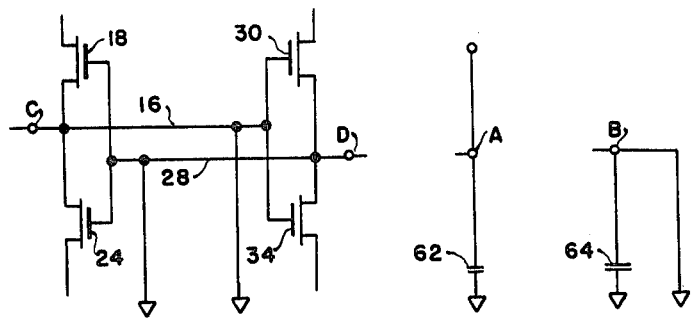
FIG. 3 is a schematic diagram of that part of the buffer circuitry in use during the precharge (PC) mode.

The circuitry of the invention accepts binary input signals at conventional TTL levels, compares those levels with a predetermined voltage level approximately midway between the maximum low and the minimum high input range of the TTL components, and produces corresponding binary output signals at CMOS circuitry levels. As shown in the schematic diagram of FIG. 1, all circuit components are either n-channel or p-channel metal oxide semiconductors which hereinafter will merely be referred to as n-transistors or p-transistors.

Input signals at TTL levels are introduced to the circuitry at input terminal 10. Terminal 10 is connected to one side of a sampling switch comprising n-transistor 12 and p-transistor 14 in parallel. The output of the sampling switch is connected to the following circuitry at node C. As will be explained in detail later, n-transistor 12 is charged to thereby render the transistor conductive by a sample pulse S whereas the p-transistor 14 is rendered conductive by the $\bar{S}$, or the inverted S signal.

Node C is the input to a dynamic comparator which, as will be subsequently described, compares the signal appearing at node C with a predetermined reference signal applied to node D. Node C is connected to conductor 16 which is coupled to the drain element of the p-transistor 18, the source element of which is connected to the drain element of p-transistor 20, the source of which is connected to a source of positive voltage applied to the terminal 22. Conductor 16 is also connected to the drain element of n-transistor 24, the source element of which is coupled to the drain of n-transistor 26, the source of which is at circuit ground reference.

The node D to which is applied the reference voltage, is connected to the conductor 28 and to the drain of the p-transistor 30, the source of which is connected to the drain of the p-transistor 32, the source of which is connected to the positive voltage terminal 22. Conductor 28 is also connected to the drain of n-transistor 34, the source of which is connected to the drain of an n-transistor 36, the source of which is at circuit ground. Conductor 16 is also coupled to the gate elements of transistors 30 and 34 while conductor 28 is connected to the gate elements of transistors 18 and 24. The gates of n-transistors 26 and 36 are connected together and to the terminal 38 to which is applied an evaluating signal, E, as will be subsequently explained. Similarly the gates of the p-transistors 20 and 32 are connected together and to the terminal 40 to which is applied the inverted evaluation signal, $\bar{E}$. Conductor 16 is connected to circuit ground reference through an n-transistor 42 and conductor 28 is similarly connected to ground reference through an n-transistor 44. The gate elements of transistors 42 and 44 are connected together and to a terminal 46 to which is applied a precharge signal, PC, as will be subsequently explained. Output signals from the circuitry are taken from conductors 16 and 28 and respectively applied through suitable output buffers 48 and 50.

Node D is connected to one side of a sampling switch comprising n-transistor 52 in parallel with p-transistor 54. The opposite side of the sampling switch is connected to node A, as illustrated. Transistor 52 is turned on by the presence of a sampling signal, S, whereas the p-transistor 54 is rendered conductive by an inverted sampling signal, $\bar{S}$. Node A is also connected to a third sampling switch comprising n-transistor 56 and p-transistor 58 in parallel. The output of this sampling switch is connected to node B, as illustrated and, as with the switch comprising transistors 52 and 54, the sampling switch comprising transistors 56 and 58 is rendered conductive by the sampling pulse and its inverted pulse.

Node A is connected to the positive voltage terminal 22 through a p-transistor 60 which is rendered conductive by an inverted precharge signal, $\overline{PC}$. Node A is also connected to the gate element of a heavy depletion load n-transistor 62 which has both source and drain elements connected to circuit ground reference so that the transistor 62 functions as a capacitor. Similarly, node B is connected to the gate element of a heavy depletion load n-transistor 64 connected to function as a capacitor. Node B is also coupled to ground reference through an n-transistor 66 which is rendered conductive by the application of a precharge, PC, pulse.

Figure 4:
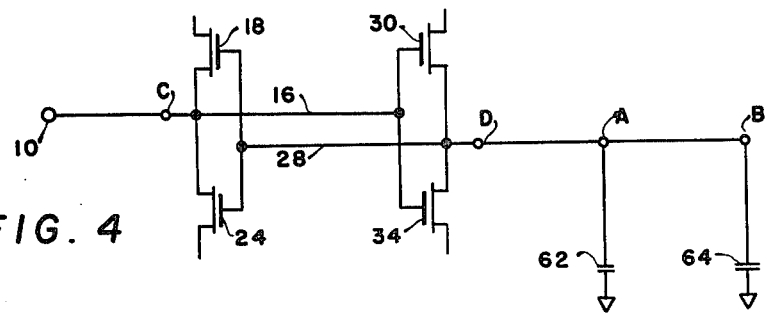
FIG. 4 is a schematic diagram of that part of the buffer circuitry in use during the sample (S) mode.
Figure 5:
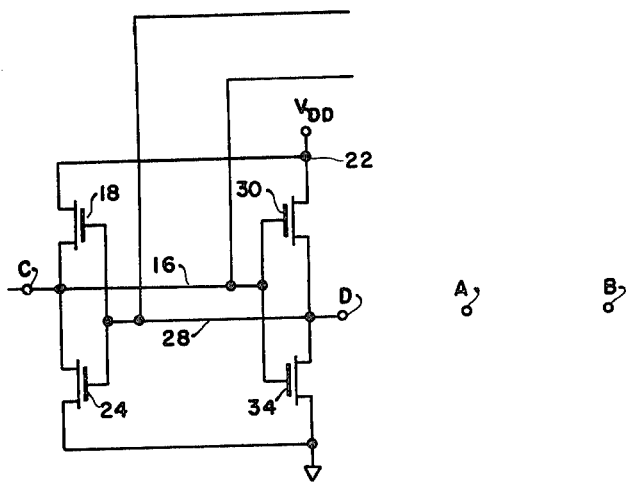
FIG. 5 is a schematic diagram of that part of the buffer circuitry in use during the evaluate (E) mode.

FIG. 2 is a timing diagram illustrating the sequence of the various pulses applied to the components of the circuitry of FIG. 1. Associated circuitry which is not part of this invention generates a system clock which may have a frequency in the order of 500 KHz. When a TTL to CMOS signal translation is to take place, a precharge pulse 68 is first generated in response to a clock pulse 70. The circuitry responsive to such a precharge pulse is illustrated in FIG. 3. Upon completion of the precharge pulse 68, a sampling pulse 72 is produced in response to the clock pulse 74. The circuitry of FIG. 1 that is responsive to the sampling pulse is illustrated in FIG. 4. Upon completion of the sampling pulse, an evaluate pulse 76 is generated in response to a subsequent clock pulse 77, the circuitry responsive to the evaluate pulse 76 is illustrated in FIG. 5.

During the precharge mode, a PC pulse is applied to the terminal 46 of FIG. 1 to render n-transistors 42 and 44 conductive. The PC pulse is also applied to the gate of n-transistor 66 and the inverted PC pulse is applied to the p-transistor 60 to render that transistor conductive. The dual transistor sampling switches are off to isolate the input terminal 10 from node C and to open the circuitry between nodes D, A and B. The circuitry responsive to the precharge pulse, PC, is illustrated in FIG. 3. The conductive n-transistors 42 and 44 of FIG. 1 ground the conductors 16 and 28, thereby removing all charges from the gates of the CMOS transistors 18, 24 and 30, 34. These transistors are also removed from ground reference and also from the positive voltage applied to the input terminal 22 of FIG. 1. Conduction through the p-transistor 60 applies the full positive voltage from terminal 22 to the gate element of the heavy depletion n-transistor 62, now shown as capacitor 62, to thereby charge the capacitor formed by that transistor. Both sides of the capacitance formed by the heavy depletion n-transistor 64 are short circuited at ground reference through the conductive n-transistor 66. Thus, the CMOS circuitry has become completely discharged and only the capacitor 62 has been precharged by the application of the PC pulse of FIG. 2.

A sample pulse, S, is applied to the circuitry after cessation of the precharge pulse, PC. Application of this S pulse will close the sample switches formed by transistors 12, 14, 52, 54, 56 and 58 of FIG. 1 and the resulting circuitry affected by this pulse is illustrated in FIG. 4. The heavy depletion transistors, now shown as capacitors 62 and 64, are now intercoupled so that the charge formerly applied to the capacitor 62 is redistributed between capacitors 62 and 64 according to the effective capacitance of each component and the intrinsic capacitance at node D. Nodes A, B and D are now intercoupled to apply to node D the charge resulting from the redistribution. The amplitude of this charge will, of course, depend upon the ratio of capacitances of the capacitors 62, 64 and node D and the $V_{DD}$ level applied to the voltage input terminal 22 of FIG. 1. For example, if the voltage applied to terminal 22 is 5.0 volts and capacitor 64 is constructed with twice the area, and hence twice the capacitance of transistor 62, the 5 volts charge applied to capacitor 62 during the precharge mode will be redistributed between the various capacitors so that the resulting reference potential applied to node D during the S mode will be approximately one-third of the 5-volt level, or approximately 1.67 volts. Thus, the reference voltage at node D will lie approximately midway between the normal 0.8 volt level representing the maximum acceptable binary "0" input of a TTL circuit and the normal 2.4 volts level representing the minimum binary "1" input threshold of a TTL device. This threshold voltage at node D is then applied to the gate elements of the CMOS pair comprising transistors 18 and 24.

Simultaneously with the application of a reference voltage to node D, a TTL input signal is applied to the input terminal 10 and to node C and hence to the gate elements of the CMOS pair comprising transistors 30 and 34.

In the evaluate mode, transistors 20, 26, 32 and 36 of FIG. 1 become conductive to apply appropriate source and drain potentials to the CMOS transistor pairs. As illustrated in FIG. 5, the circuitry now becomes a cross-coupled latch comparator which compares the charge at node C with the threshold level previously applied to node D. If the level on node C is higher than that on node D, a very temporary circuit unbalance will occur instantly followed by stabilization in which the n-transistor 34 and p-transistor 18 become conductive, the n-transistor 24 and p-transistor 30 become non-conductive, and the circuit becomes latched in that condition to produce a high output on conductor 16 and a low output on conductor 28. Conversely, if the reference potential at node D is greater than the TTL input signal at node C, the circuit will become stabilized with transistors 24 and 30 on, and transistors 18 and 34 off, to produce a high output on conductor 28 and a low on the conductor 16 their respective output buffers.

It will be noted that no D.C. current is drawn by the circuitry during the precharge mode in which the capacitor 62 is charged or during the evaluate mode which senses the output of the dynamic comparator comprising the CMOS transistor pairs, and that negligible amount of current is drawing during the sample mode. During operation with a microprocessor, dynamic power may be reduced by cycling the clocks to the circuitry only when TTL inputs are to be evaluated. Furthermore, if the circuitry is held in either the percharge state or the evaluate state, no dynamic power is consumed.

I claim:
1. CMOS circuitry for the dynamic translation of input signals at TTL levels into corresponding output signals at CMOS levels, said circuitry comprising:
   reference generating means for generating a reference potential at a first point in the circuitry, said potential being at a level between the highest TTL voltage representing a binary "0" and the lowest TTL voltage representing a binary "1";

input signal means including a TTL level signal input terminal for introducing an input signal at a TTL level to a second point in said circuitry; and a bistable CMOS latch having a reference input coupled to said reference potential at said first point and a second input coupled to said TTL level signal input at said second point and outputs for said CMOS levels, for latching at one CMOS logic level or the other CMOS logic level depending upon the sign of the voltage difference between said first and said second points, and where said reference potential is established by the ratio of the areas of two capacitors;

means for precharging said capacitors to predetermined voltage levels by coupling them to predetermined bias voltages;

means for coupling said capacitors together in parallel after said precharge operation such that the final voltage across the pair depends upon the ratios of their areas and their precharge voltages and for coupling said capacitors to said reference input such that the voltage across the pair of capacitors becomes said reference potential.

2. CMOS circuitry for the dynamic translation of input signals at TTL levels into corresponding output signals at CMOS levels, said circuitry comprising:

reference generating means for generating a reference potential at a first point in the circuitry, said potential being at a level between the highest TTL input threshold voltage representing a binary "0" and the lowest TTL input threshold voltage representing a binary "1";

input signal means including a signal input terminal for introducing an input signal at a TTL level to a second point in said circuitry; and signal comparison means coupled to said first and said second points in said circuitry for comparing the levels between said reference potential and said input signal and for producing a CMOS output signal corresponding to the TTL input signal, said comparison means including first and second CMOS transistor devices connected to a cross-coupled latch; and wherein said reference generating means comprises a first capacitor for charging to a fixed level, means for allowing charging of said first capacitor to said fixed level from a voltage source and then for disconnecting said voltage source from said first capacitor, a second capacitor, means for allowing coupling of said second capacitor in parallel with said first capacitor and for coupling said paralleled first and second capacitors to said first point in said circuitry such that the charge on said first capacitor is redistributed according to the ratio of capacitances.

3. The CMOS signal translation circuitry claimed in claim 2 wherein said first and second capacitors are depletion transistors connected as capacitors.

4. The CMOS signal translation circuitry claimed in claim 3 further including precharge circuitry responsive to a first clocking pulse for removing residual charges from said first and second points in said translation circuitry and from said second capacitor.

5. The CMOS signal translation circuitry claimed in claim 4 further including first, second and third transistor switches respectively interposed between said TTL signal input terminal and said second circuitry point, between said first circuitry point and said first capacitor, and between said first capacitor and said second capacitor, said transistor switches being rendered conductive by the application of a second clocking pulse occurring after the cessation of said first clocking pulse.

6. The CMOS signal translation circuitry claimed in claim 5 further including third and fourth transistor devices coupling said first and second transistor devices to a voltage source and wherein a third clocking pulse occurring after cessation of said second clocking pulse operated to close said third fourth transistor devices to couple said first and second CMOS transistor devices in said signal comparison means to their respective voltage sources.

* * * * *